United States Patent
Ju et al.

(10) Patent No.: US 7,011,998 B1
(45) Date of Patent: Mar. 14, 2006

(54) HIGH VOLTAGE TRANSISTOR SCALING TILT ION IMPLANT METHOD

(75) Inventors: Dong-Hyuk Ju, Cupertino, CA (US); Nga-Ching (Alan) Wong, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/756,573

(22) Filed: Jan. 12, 2004

(51) Int. Cl.
*H01L 21/336* (2006.01)
*H01L 21/8234* (2006.01)

(52) U.S. Cl. .................. 438/197; 438/217; 257/335
(58) Field of Classification Search .............. 438/197, 438/217, 286, 289; 257/335
See application file for complete search history.

(56) References Cited

U.S. PATENT DOCUMENTS

| | | | | |
|---|---|---|---|---|
| 6,107,129 A | * | 8/2000 | Gardner et al. | 438/230 |
| 6,107,149 A | * | 8/2000 | Wu et al. | 438/303 |
| 6,258,680 B1 | * | 7/2001 | Fulford et al. | 438/305 |
| 6,576,965 B1 | * | 6/2003 | Eikyu et al. | 257/408 |
| 6,580,149 B1 | * | 6/2003 | Tran et al. | 257/549 |
| 6,759,288 B1 | * | 7/2004 | Tran et al. | 438/194 |
| 2002/0105066 A1 | * | 8/2002 | Eikyu et al. | 257/685 |

OTHER PUBLICATIONS

Wplf, Stanley; Silicon Processing for the VLSI Era vol. 2: Process Integration; pp. 298-299; 1990; Lattice Press, Sunset Beach, CA.*

* cited by examiner

*Primary Examiner*—George Fourson
*Assistant Examiner*—Fernando L. Toledo

(57) ABSTRACT

The present invention is a high voltage transistor formation method and system that includes a varying or gradient concentration lightly doped drain and source implant region. The lightly doped drain (LDD) implant region has gradient concentration characteristics that provide a higher concentration under a source and drain and lower concentration close to a surface source drain channel formation under a gate. A lightly doped drain tilt implant process is utilized to form a component area (e.g., a transistor source and/or drain area) with gradient doping profiles. The varying concentration profile provides a smooth electrical characteristic transformation between regions that reduces the probability of hot electron generation otherwise associated with electrical fields that cross abrupt changes between different conductivity orientation regions. The higher concentration of the light dopants at the bottom of the source and drain regions also helps reduce the probability of deep junction breakdown.

12 Claims, 8 Drawing Sheets

HIGH VOLTAGE TRANSISTOR SCALING TILT ION IMPLANT METHOD

TECHNICAL FIELD

The present claimed invention relates to the field of transistor fabrication. More particularly, the present invention relates to a high voltage transistor fabrication system and method that utilizes a tilt ion implant to form a concentration gradient in the source and drain regions.

BACKGROUND ART

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data, ideas and trends in most areas of business, science, education and entertainment. Electronic systems designed to produce these results often comprise integrated circuits fabricated on semiconductor chips. Transistors are one of the most prolific basic building blocks of modern electronic circuits and they typically require a variety of electrical characteristics to be maintained between different component regions to achieve proper operation. Fabricating relatively small sized high voltage transistors with the ability to maintain requisite electrical relationships between component regions is usually very difficult.

Integrated circuit fabrication usually involves complicated processes that attempt to produce precise components and it is often very difficult to achieve optimized results within requisite tolerances. For example, transistor fabrication processes typically include diffusion and implantation operations directed at creating regions with particular electrical characteristics. Transistors typically include a "negatively" doped region and a "positively" doped region. The operation of the transistor is based upon the electrical interaction of these regions and the ability of these regions to influence current flow under certain conditions. The electrical characteristics of these regions and their "barrier" junctions is critical to proper operation of the device.

Semiconductor integrated circuit (IC) manufacturing efforts are usually complicated by ever increasing demands for reduced component sizes. The desire for smaller transistor sizes is typically driven by several motivations, including a desire for faster devices that provide greater functionality and mobility. Scaling down of IC dimensions typically reduces capacitance which usually permits higher speed performance in integrated circuits. More complicated circuits are usually required to satisfy the demand for greater functionality and there is usually a proportional relationship between the number of components included in an integrated circuit and the functionality, integrated circuits with more components typically provide greater functionality. Including more components within an integrated circuit often requires smaller components densely packed in relatively small areas. Moreover, reducing area of an IC die leads to higher yields in IC fabrication. However, reliably reducing the size of IC components is usually very difficult. For example, as the size of each component region of a transistor is reduced there is typically an adverse impact on the ability of the transistor to maintain critical electrical relationships and characteristics. These adverse impacts are often magnified by the increased field effects created in high voltage transistors.

Reducing the size of a transistor typically involves shorting the channel length. However, shorting channel length can cause several problems. As the channel is shortened, the maximum electric field becomes more isolated near the drain side of the channel causing a saturated condition that increases the maximum energy on the drain side of the device. The high energy often results in the production of "hot" electrons in the channel region that can degrade performance and cause junction breakdown. The problems associated with hot electrons often manifest themselves as undesirable decreases in the saturation current, decreases of the transconductance and a continual reduction in device performance caused by the trapped charge accumulation in the gate. Hot electrons can overcome the potential energy barrier between the silicon substrate and the silicon dioxide layer overlying the substrate, which results in the injection of hot electrons into the gate region. Injection of hot electrons into the gate region can cause alteration of the charge characteristics of the gate region which in turn can detrimentally impact the threshold voltage characteristics (e.g., permanently increase the threshold voltage). The injection of hot electrons can also cause a generation of a undesirable gate current.

Another problem often encountered in short channel junctions is increased punch through effects. Punch through effects are caused by carriers "punching trough" across the channel region from one heavily-doped region to the other in the absence of a gate current (e.g., a current resulting from a voltage being applied to the gate). Punch through typically occurs due to the decreased barrier resistance between a source and drain depletion area that can occur when a channel is shortened. Punch through effects significantly impact the desired ability to control current flow between a source and a drain with a predetermined threshold voltage by producing a current flow regardless of the threshold voltage. Furthermore, the electric fields produced in high voltage applications increase the probability of adverse impacts due to junctions breakdown and punch trough as device sizes and regions are reduced.

Thus, it is desirable for integrated circuit fabrication technologies to provide an advantageous balance between component integrity and increased component density. It is important for source and drain regions to be accurately fabricated to ensure proper operation without defects. It is also desirable for the source and drain formation to be efficient and low cost. Formation of high quality source and drain components that provide desirable operating characteristics can be challenging. Therefore, the ability to precisely form source and drain sections in a convenient and efficient manner is very important.

SUMMARY OF THE INVENTION

The present invention is a high voltage transistor formation method and system. A present invention high voltage transistor includes a varying or gradient concentration profile implant region. The implant region has a concentration profile that provides a higher concentration of dopants under the center of a source and drain region and a lower concentration close to the substrate surface and partially under a gate. This facilitates fabrication of smaller (e.g., with shorter channels) relatively high voltage signal switching transistors with minimal or no detrimental hot electron impacts. The gradient concentration qualities also facilitate utilization of channel dopant halos that provide increased breakdown resistance. A lightly doped drain tilt implant process is utilized to form a component area (e.g., a transistor source and/or drain area) with gradient doping profiles. The dopant (e.g., phosphorous) is implanted at the angle from a plurality of different directions or orientations (e.g., four different directions around the gate) which creates a relatively high concentration under a source or drain region which varies to a light concentration region close to the substrate surface under the transistor gate. The higher concentration of the light dopants at the bottom of the source and drain regions also helps reduce the probability of deep junction breakdown. In one embodiment, a halo region is also implanted under the lightly doped regions to increase breakdown resistance and improve short channel characteristics.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

The present invention is a high voltage transistor formation method and system. A present invention high voltage transistor includes a varying or gradient dopant implant concentration profile that provides a higher concentration under the center of a source and drain region and a lower concentration close to the substrate surface and partially under a gate. In one embodiment of the present invention the lightly dopant concentration profile is referred to as a lightly doped drain (LLD). The term "lightly dope drain" or "LLD" is utilized herein in a generic sense and can apply to both a drain and/or a source region. The varying concentration profile provide a smooth electrical characteristic transformation between regions that reduces the probability of hot electron generation otherwise associated with electrical fields that cross abrupt changes between different conductivity orientation regions with relatively high dopant concentrations. The higher concentration of the light dopants at the bottom of the source and drain regions also helps reduce the probability of deep junction breakdown.

Figure 1A:
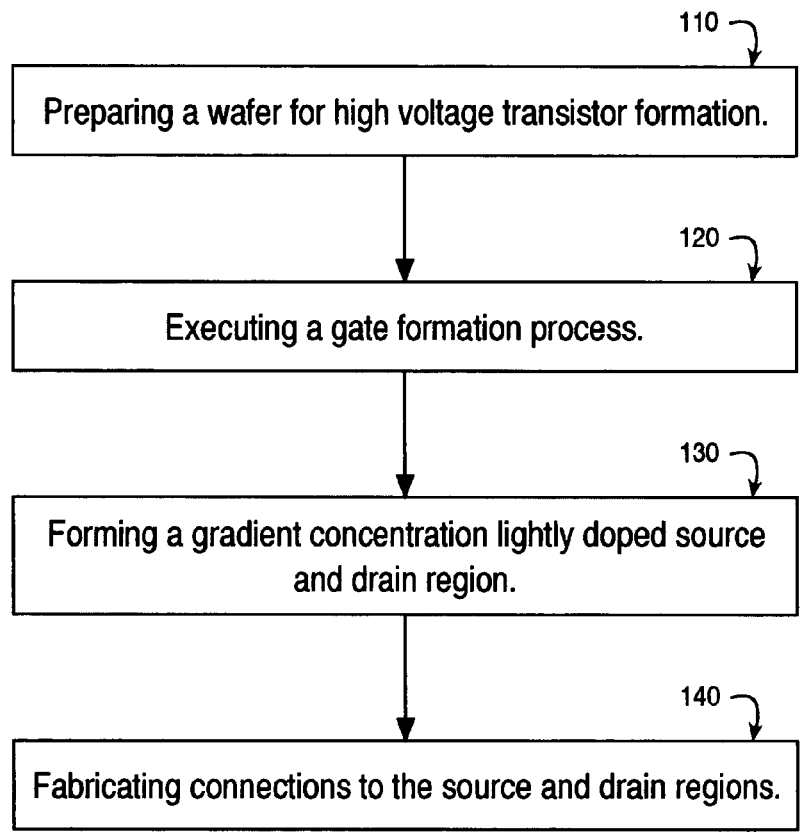
FIG. 1A is a flow chart of a high voltage transistor formation method in accordance with one embodiment of the present invention.

FIG. 1A is a flow chart of high voltage transistor formation method 100, one embodiment of the present invention. High voltage transistor formation method 100 provides a lightly doped drain and source implant region that provides gradient dopant characteristics which facilitate prevention of hot electron generation and deep substrate breakdown while enabling accurate surface channel operation. Thus, high voltage transistor formation method 100 facilitates fabrication of high voltage transistors with desirable operation and breakdown characteristics.

In step 110, a wafer substrate is prepared for high voltage transistor formation. In one embodiment of the present invention, a wafer substrate is made smooth and level, for example by a chemical mechanical polishing process. A protective layer of oxide and a subsequent layer of nitride are deposited on the surface. Additional polishing can be performed to provide a smooth and level surface after the protective oxide and nitride layers are added.

Figure 2A:
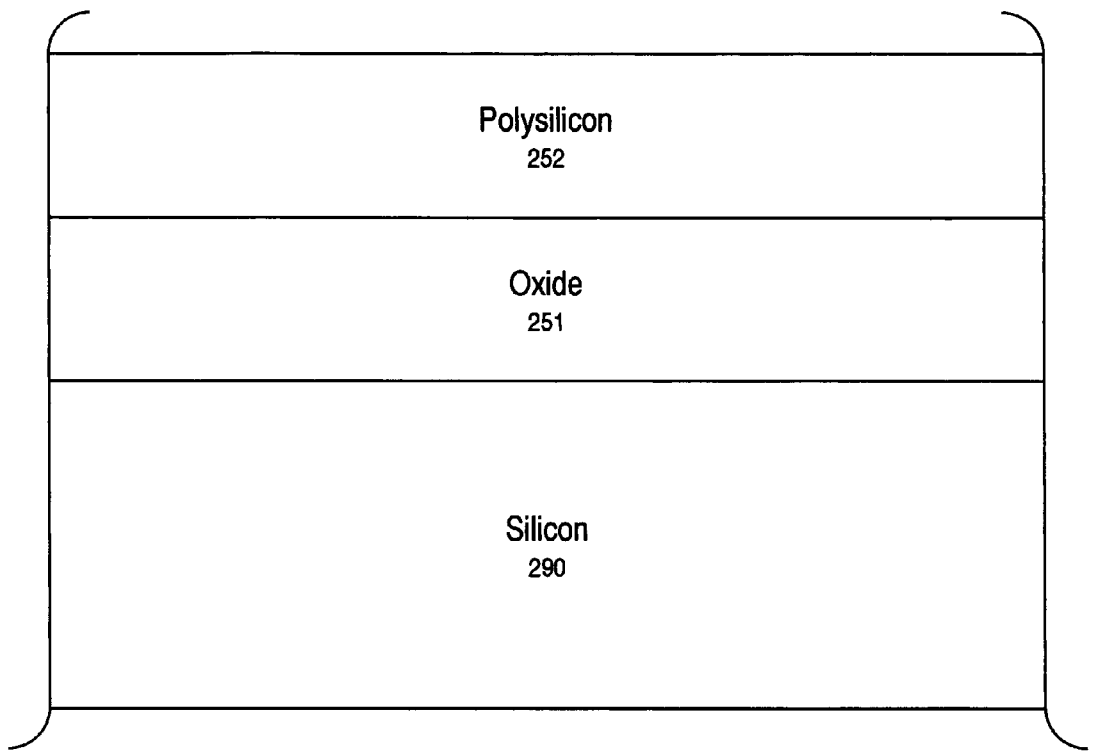
FIG. 2A is an illustration of gate formation layers in one exemplary implementation of the present invention.

At step 120, a gate formation process is executed. FIG. 2A is an illustration of gate formation layers in one exemplary implementation of the present invention. In one embodiment of the present invention an insulating layer 251 (e.g., oxide) is deposited on top of the substrate 290 (e.g., silicon). A gate layer 252 (e.g., polysilicon) is deposited on top of the insulating layer. Excess materials deposited during the gate formation process are removed (e.g., etched) from areas not included in a gate (e.g., over a source or drain area).

A gradient concentration lightly doped drain and source region are formed in step 130. In one embodiment of the present invention, a lightly doped drain and source region have a dopant concentration that varies from a higher concentration (e.g., 4x) in an area relatively deep into the wafer substrate under the drain and source area to a lower concentration (e.g., 1x) under the gate area closer to the wafer surface and the surface channel between the source and drain regions. The higher concentration of the light dopants at the bottom of the source and drain regions also helps reduce the probability of deep junction breakdown. In one exemplary implementation of the present invention, the gradient concentration lightly doped drain and source region are formed by a present invention lightly doped tilt implant process.

In step 140, connections to the source and drain regions are fabricated. In one embodiment of the present invention, a connection layer (e.g., a metal layer) is deposited over the source and drain areas respectively. In one exemplary implementation the metal layer is one of a plurality of metal layers (e.g., separated by insulation layers) that couple sources and drains to other components included in the wafer.

Figure 1B:
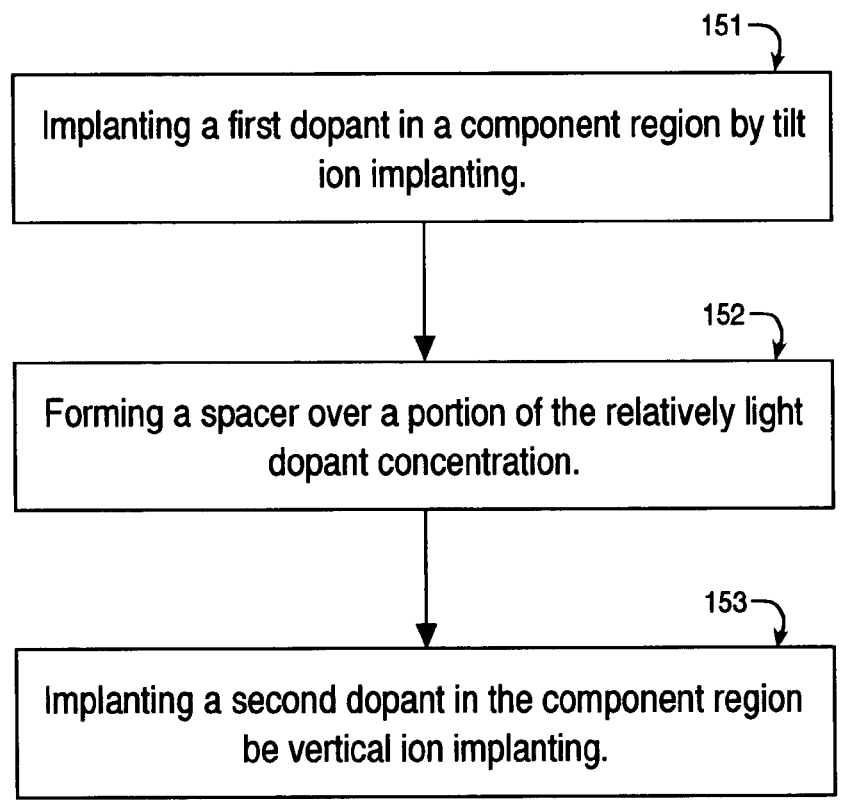
FIG. 1B is a flow chart of lightly doped tilt implant process, one embodiment of a present invention lightly doped drain tilt implant process.

FIG. 1B is a flow chart of lightly doped tilt implant process 150, one embodiment of a present invention lightly doped drain tilt implant process. Lightly doped tilt implant process 150 is utilized to form a component region (e.g., a transistor source and/or drain area) with gradient doping concentration profiles. For example, creation of a lateral gradient with a varying n plus dopant concentration profile. The gradient doping profiles provided by lightly doped tilt implant process 150 provide component features with advantageous electrical characteristics. For example, the gradient doping profiles provide greater protection against junction barrier breakdown in designated areas (e.g., under a source or drain region) while permitting appropriate current flow in other designated areas (e.g., to or from a transistor source to drain channel). In one exemplary implementation, the n plus dopant concentration is relatively very high in an arsenic transistor source or drain region and varies from a relatively high dopant concentration in a deep phosphorous region (e.g., under the arsenic) that is four times greater that a lightly doped phosphorous region close to the substrate surface and partially under the transistor gate. The gradient doping profiles provided by lightly doped tilt implant process 150 can increase junction breakdown protection.

In step 151, a first dopant is implanted in a component region by tilt ion implanting. In one embodiment of the present invention, the component region includes a transistor source and drain region. The dopant is implanted at a tilted angle (e.g., from a 32 degree to 45 degree tilt) and penetrates under a gate area. The first dopant forms a relatively light dopant concentration extending laterally under a portion of the gate region and close to the substrate surface. In one exemplary implementation, the dopant is implanted at the angle from a plurality of different directions or orientations (e.g., four different directions around the gate). The implantation from the plurality of different directions or orientations can be performed sequentially or simultaneously. In one exemplary implementation the dopant is phosphorous.

Figure 2B:
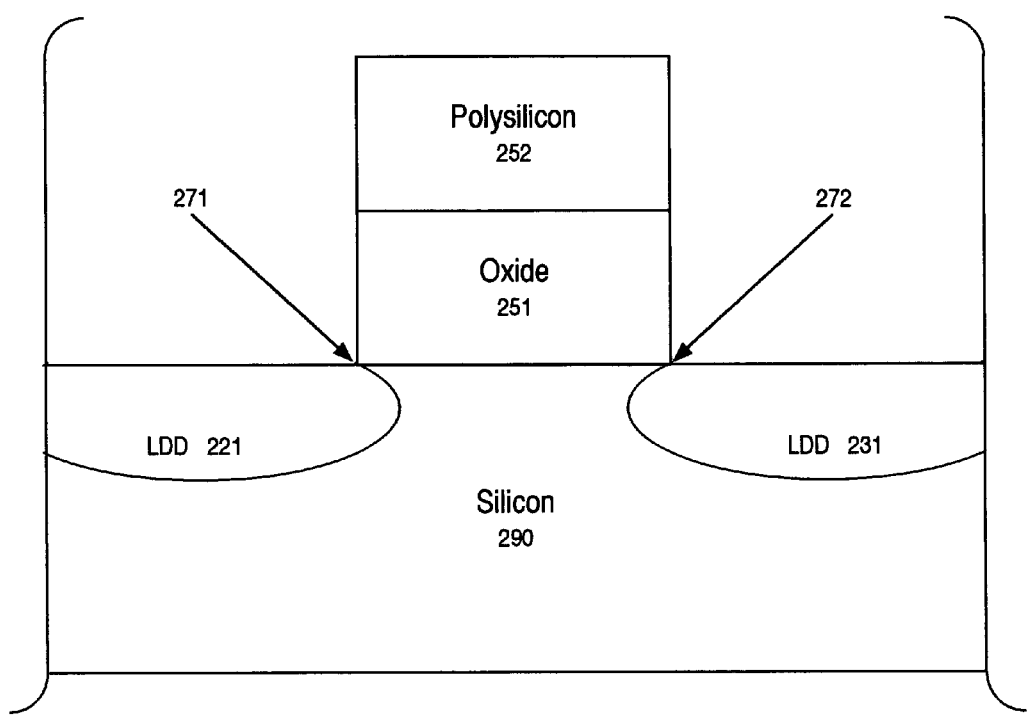
FIG. 2B is an illustration of an exemplary component region formed by a present invention tilt ion implanting process.

FIG. 2B is an illustration of a component region formed by a present invention tilt ion implanting process. Polysilicon gate 252 gate region and gate insulting oxide region 251 are formed by removing excess material deposited during gate formation as shown in FIG. 2A. Lightly dope regions 221 and 231 are formed by implanting a dopant at an angle from orientations 271 and 272. In one exemplary implementation, the wafer is rotated 90 degrees so that angle orientations 271 and 272 are pointing into and out of the page. More dopant is implanted from the rotated orientations providing dopant coverage under gate 252 from all four directions (e.g., left, right, into and out of the page). The portions of lightly doped regions 221 and 231 that are not under polysilicon gate 252 and insulating oxide 251 are exposed to additional dopant when the transistor is rotated and thus the dopant concentration is higher in areas closer to the center of lightly doped regions 221 and 231 not under gate 252.

In step 152, a spacer is formed over a portion of the relatively light dopant concentration. In one embodiment of the present invention, the spacer is a sidewall spacer on the gate of a transistor. For example, a sidewall spacer material is deposited on the sides of the gate area and excess sidewall spacer material is removed (e.g., over the source and drain regions).

In step 153, a second dopant is implanted in the component region by vertical ion implanting. In one embodiment of the present invention, the second dopant penetrates the substrate in a substantially vertical orientation. The second dopant can be the same chemical as the first dopant (e.g., phosphorous) or it can be a different chemical (e.g., arsenic). In one exemplary implementation, the second dopant forms a relatively high concentration region (e.g., a high n type concentration region).

Figure 2C:
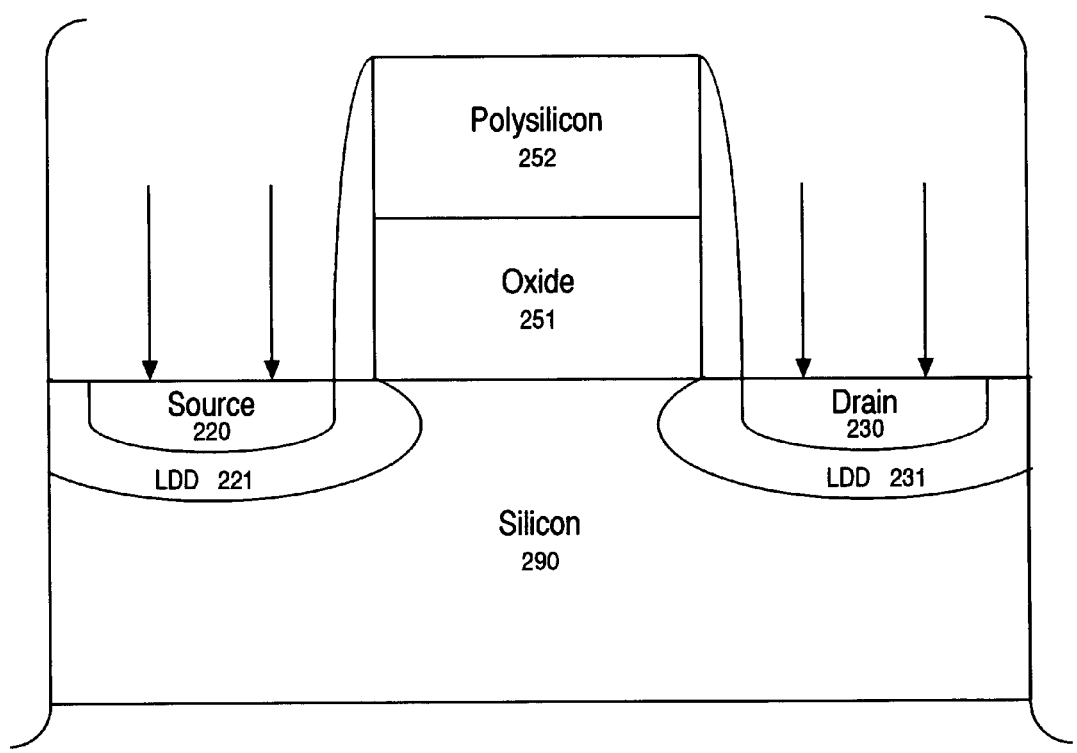
FIG. 2C is an illustration of an exemplary source and drain formed by vertical ion implanting in accordance with one embodiment of the present invention.

FIG. 2C is an illustration of a source 220 and drain 230 formed by vertical ion implanting.

Figure 3:
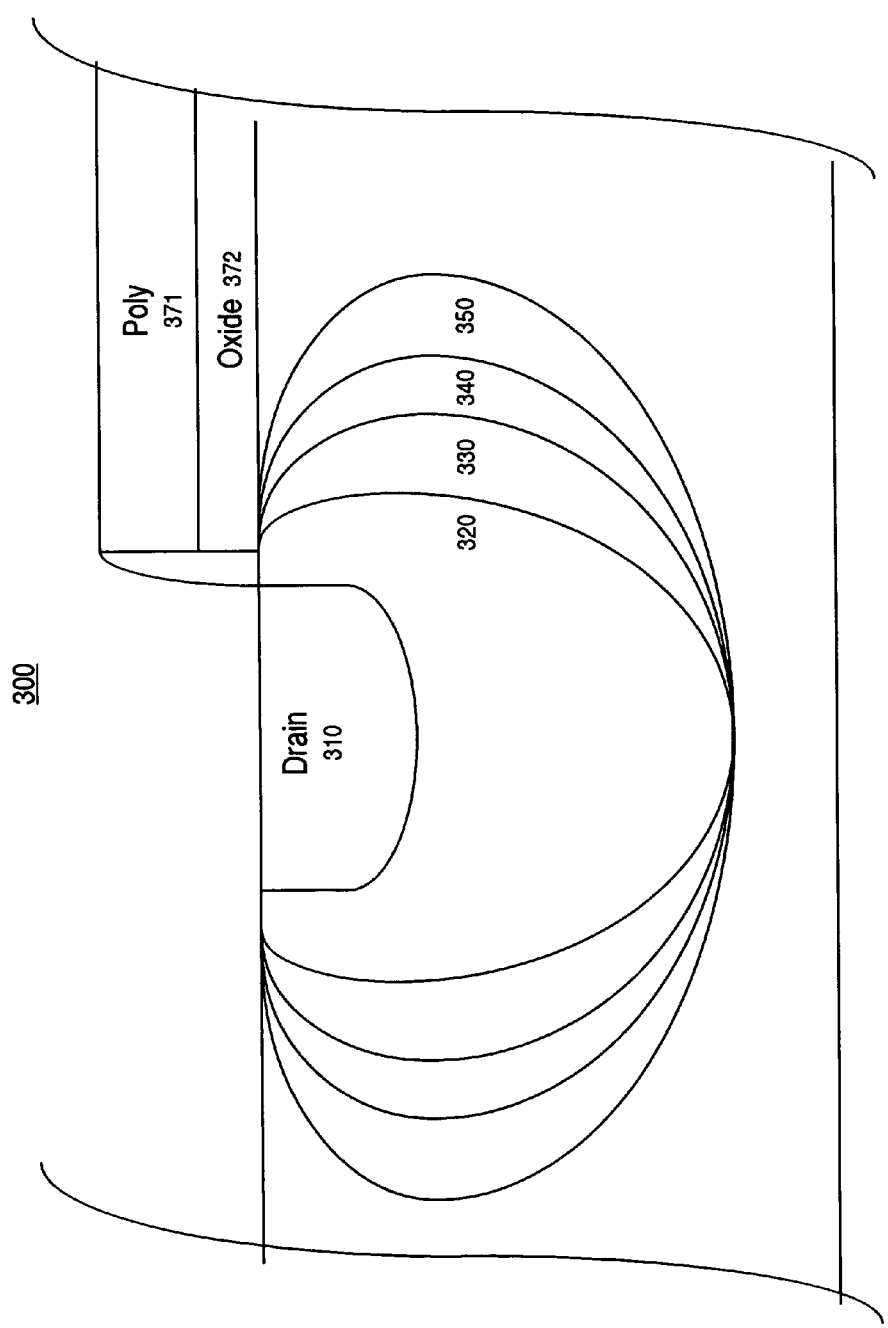
FIG. 3 is an illustration of one exemplary gradient concentration formed by the present invention.

The tilted ion implanting from multidirectional orientations facilitates better coverage of the component and formation of concentration gradients or variances. For example, a 4 way implant "covers" four sides of a transistor gate. The 4 way implant "covers" the 4 sides of the transistor by putting a one × concentration of the relatively light dopant slightly under the gate region and a 3× or 4× concentration of the relatively light dopant in areas under the source and drain region. FIG. 3 is an illustration of one exemplary gradient concentration formed by the present invention. For example, varying regions of first dopant concentration 320, 330, 340 and 350 vary from a relatively high concentration in region 320 to a relatively low concentration in region 350 that extends partially under gate 371 and insulator 372. Drain region 310 includes a second dopant heavy concentration region. In one exemplary implementation, the first and second dopants are different chemicals and in another they are the same.

The higher concentration of the "light dopant" at the bottom of the source and drain regions provide additional deep junction breakdown protection. This is very convenient since the heavily doped concentrations of the second dopant are often limited to shallow implantation. The present invention implantation at an angle from a variety or orientations provides added protection in addition to the second dopant at the bottom of the drain region.

Figure 4:
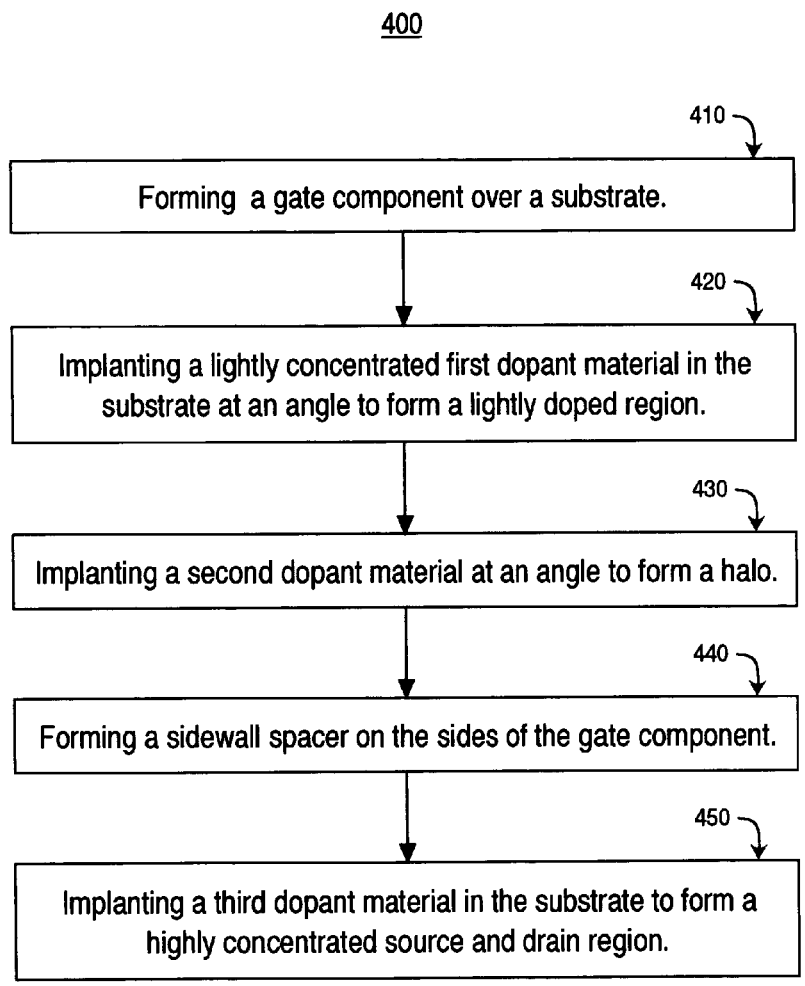
FIG. 4 is a flow chart of high voltage lightly doped drain (LDD) halo transistor fabrication method in accordance with one embodiment of a present invention high voltage transistor fabrication method.

FIG. 4 is a flow chart of high voltage lightly doped drain (LDD) halo transistor fabrication method 400, one embodiment of a present invention high voltage transistor fabrication method. High voltage LDD halo transistor fabrication method 400 is similar to of high voltage transistor formation method 100 in the formation of a gradient lightly doped region in a source and/or drain. High voltage LDD halo transistor fabrication method 400 also includes the formation of a halo region. The halo region provides additional protection against deep junction breakdown or punch through by bolstering the junction barrier characteristics of a source or drain.

In step 410, a gate component is formed over a substrate. In one embodiment of the present invention the gate component comprises a gate electrode layer and an insulating layer. The gate electrode can comprise a variety of materials including metals (e.g., aluminum, copper, tungsten, titanium, etc.) or polysilicons. The insulating layer can be made by a variety of methods including thermal oxidation in an inert gas, chemical vapor deposition, or physical vapor deposition and can include a variety of dielectric materials including silicon dioxide (SiO2) or silicon oxynitride (SiOxNy).

At step 420, a lightly concentrated first dopant material is implanted in the substrate at an angle to form a lightly doped region (e.g., an LDD region). In one embodiment of the present invention, the angle is directed into a source or drain region and under the gate component. The first dopant material can be a p-type dopant (e.g., boron, etc.) or an n-type dopant (e.g., phosphorous, arsenic, etc.) depending upon the of MOS device being formed (e.g., NMOS or PMOS). In one exemplary implementation, the implant energies of the first dopant implant are 5 to 25 keV and the dopant dosage in the range of 1E13 ($1\times10^{13}$) dopant atoms/ cm² to 5E14 (5×10¹⁴) dopant atoms/cm². It is appreciated that higher or lower dopant concentrations and energies can be used.

In one embodiment of the present invention, the first dopant is implanted at an angle from multiple orientations with respect to the gate component. For example, the first dopant can be implanted from four different orientations with respect to the gate component. The implantation from four different orientations can be performed simultaneously or sequentially. The resulting lightly doped region concentration varies in a gradient manner from a lightest doped concentration that extends laterally under a portion of the gate component (e.g. adjacent to a conduction channel region between a source component and a drain component) to a highest concentration at the bottom of the component region (e.g., at the bottom of a source and/or drain region).

A second dopant material is implanted at an angle to form a halo region under the gate component in step 430. In one exemplary implementation of the present invention, the halo region is adjacent to the lightly concentrated first dopant region created in step 420. The halo dopant can be forced deeper into the substrate than the lightly doped regions and also adjacent to a heavier concentration areas. The second dopant material can be a different conductivity type than the first dopant. For example, if the first dopant (e.g., an LDD) is a n-type dopant (e.g., arsenic, phosphorous, etc.) the second dopant (e.g., a halo) can be a p-type (e.g., boron, etc.) and if the first dopant is a p-type the second dopant can be a n-type.

It is appreciated that there are a variety of method for implanting the second dopant to form a halo region. In one embodiment of the present invention, implant of the second dopant material can be in the range of 5 to 40 keV and the dopant dosage can be in the range of 5E12 keV (5×10¹²) dopant atoms/cm² to 1E14 (1×10¹⁴) dopant atoms/cm². In one exemplary implementation a halo region is formed by the implantation of an amorphization dopant followed by a halo dopant that can be activated by a variety of processes (e.g., laser thermal process, rapid thermal annealing, etc.).

In step 440, a sidewall spacer is formed on the sides of the gate component. In one embodiment of the present invention, the sidewall spacer includes multiple layers. For example, the sidewall spacer can include a first dielectric layer (e.g., an oxide material) and a second material that can be selectively etched with respect to the first sidewall layer. In one exemplary implementation, the thickness of the sidewall spacer can be in a range of 50 to 150 angstroms thick. The thickness of the sidewall spacer can depend in part upon a desired separation of a heavily doped active region from the gate component, the size of the lightly doped region, etc.

In step 450, a third dopant material is implanted in the substrate to form a highly concentrated source and drain region. In one embodiment of the present invention, the third dopant is implanted into the substrate from a substantially vertical orientation into the source or drain region. In one exemplary implementation the third dopant material is of the same conductivity or charge type (e.g., n-type or p-type) as the first dopant material. The implant energies of the third dopant materials can be in the rage of 5 keV to 30 keV and the dopant dosage can be in the range of 5E14 (5×10⁴) dopant atoms/cm² to 5E15 (5×10¹⁵) dopant atoms/cm². Again, these are just exemplary ranges and it is appreciated that higher or lower dopant concentrations and energies can be used.

Figure 5:
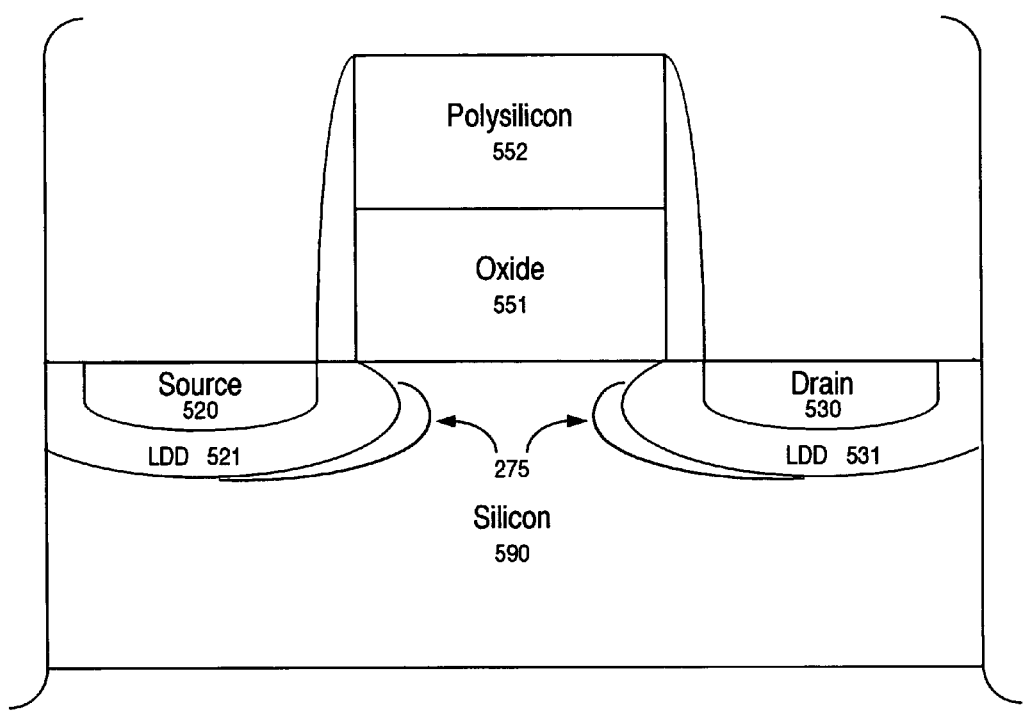
FIG. 5 is an illustration of an exemplary implementation of a high voltage transistor in accordance with one embodiment of the present invention.

FIG. 5 is an illustration of an exemplary implementation of a high voltage transistor in accordance with one embodiment of the present invention. A control gate component includes a gate 552 which has a capacity to receive a charge and remain insulated by oxide 551 and sidewall spacers 571 and 572. Substrate component 590 has a charge doping characteristic and is coupled to the gate component. A source component includes a first dopant region 521 (e.g., phosphorous) having a gradient dopant concentration and a second dopant region 520 with opposite charge doping characteristics to the substrate 590. A drain component includes a first dopant region 531 having a gradient dopant concentration and a second dopant region 530 with opposite charge doping characteristics to the substrate. The source component and drain component form gradient dopant concentration junctions with a channel. The gradient dopant concentration regions of the source and drain components minimize generation of hot electrons due to field effects and increase deep junction breakdown resistance characteristics. Halo regions 275 provide resistance to punch through effects. In one example the halo region has similar charge doping characteristics to the substrate.

It is appreciated that the order of steps of the present invention can vary. For example, the lightly doped region can be implanted before the halo region or vise versa, or the heavily doped source and/or drain region can be implanted before the lightly doped gradient region or vise versa. It is also appreciated that the substrate can be rotated during implantation of the gradient lightly doped regions and halo regions to provide symmetrical regions is the substrate.

A rapid thermal anneal (RTA) for the source/drain junctions can be performed to enhance the diffusion of the dopants implanted in the deep source/drain junction to achieve better device performance. The heavier dopant concentration region forms a low resistance deep drain junction and since they are spaced farther away from the channel by the lower concentrated regions, they can be made deep without impacting the device operation. The deeper penetration lowers sheet resistance and the contact resistance of the drain.

Thus, the present invention facilitates precise formation of high voltage source and drain sections in a convenient and efficient manner. The gradient dopant concentration reduces abruptness in conductivity profile changes between different regions and thereby reduces the probability of detrimental electric field levels and associated hot electron injections Reducing the maximum electric field effect in a channel can facilitate control of hot carrier injections into the channel and gate regions. The varying concentration gradient of the lightly doped region distributes the electrical along a larger lateral distance (rather than abrupt) so that the voltage drop is shared by the channel and the source and/or drain. The lightly doped regions act as parasitic resistors that absorb some of the energy and thereby facilitate reduction of hot electron formation. The higher concentration of the light dopants at the bottom of the source and drain regions also helps reduce the probability of deep junction breakdown. The reduced adverse field effects also facilitate the utilization of halo regions that further reduce the probability of punch through effects. In addition, utilizing the gradient concentration source and drain enables the use of smaller components permitting faster operation and greater component density.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A high voltage transistor formation method comprising:
   preparing a wafer substrate for high voltage transistor formation;
   executing a gate formation process;
   forming a gradient concentration lightly doped source and drain regions, wherein the lightly doped drain and source regions have a dopant concentration that varies from a higher concentration in an region relatively deep into the wafer substrate under the source sand drain regions to a lower concentration closer to the wafer surface and extending laterally under a portion of the gate;
   implanting a second dopant at an angle to form a halo region extending under a portion of the gate component, wherein the halo dopant is forced deeper into the substrate than the lightly doped regions and adjacent to a heavier concentration regions; and
   fabricating connections to the source and drain regions.

2. A high voltage transistor formation method of claim 1 further comprising depositing a gate on top of an insulating layer.

3. A high voltage transistor formation method of claim 1 wherein the gradient concentration lightly doped drain and source regions are formed by a lightly doped tilt implant process.

4. A high voltage transistor formation method of claim 1 wherein the dopant is implanted at a tilted angle and penetrates under the gate.

5. A high voltage transistor formation method of claim 1 wherein the dopant is implanted at the angle from a plurality of different directions or orientations.

6. A high voltage transistor formation method of claim 1 wherein a light concentration of the relatively light dopant is formed slightly under the gate region and a higher concentration of the relatively light dopant is formed under the source and drain regions.

7. A high voltage transistor formation method of claim 1 further comprising implanting a second dopant in the source and drain regions by vertical ion implanting.

8. A high voltage lightly doped drain halo transistor fabrication method comprising:
   forming a gate component over a substrate;
   implanting a lightly concentrated first dopant in the substrate at an angle to form a lightly doped drain region extending laterally under a portion of the gate and a heavy first dopant concentration towards the bottom center of a drain region;
   implanting a second dopant at an angle to form a halo region extending under a portion of the gate component, wherein the halo dopant is forced deeper into the substrate than the lightly doped regions and adjacent to a heavier concentration regions;
   forming a sidewall spacer on the sides of the gate component; and
   implanting a third dopant material in the substrate to form a highly concentrated source and drain region.

9. A high voltage lightly doped drain halo transistor fabrication method of claim 8 wherein the first dopant implantation angle is directed into the drain region and partially under the gate component.

10. A high voltage lightly doped drain halo transistor fabrication method of claim 8 wherein the first dopant is implanted at an angle from multiple orientations with respect to the gate component.

11. A high voltage lightly doped drain halo transistor fabrication method of claim 10 wherein the resulting lightly doped region concentration varies in a gradient manner from a lightest doped concentration under the gate component to a highest concentration towards the bottom center of the drain region.

12. A high voltage lightly doped drain halo transistor fabrication method of claim 8 wherein the halo region is adjacent to the lightly concentrated first dopant region.

* * * * *